US009588911B2

(12) United States Patent
Yamaoka et al.

(10) Patent No.: US 9,588,911 B2
(45) Date of Patent: *Mar. 7, 2017

(54) SEMICONDUCTOR SYSTEM FOR IMPLEMENTING AN ISING MODEL OF INTERACTION

(71) Applicant: HITACHI, LTD., Tokyo (JP)

(72) Inventors: Masanao Yamaoka, Tokyo (JP); Takashi Oshima, Tokyo (JP); Masato Hayashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 143 days.

This patent is subject to a terminal disclaimer.

(21) Appl. No.: 14/642,266

(22) Filed: Mar. 9, 2015

(65) Prior Publication Data

US 2016/0064080 A1    Mar. 3, 2016

(30) Foreign Application Priority Data

Aug. 29, 2014    (JP) ................................ 2014-176385

(51) Int. Cl.
| | |
|---|---|
| G06F 13/16 | (2006.01) |
| G06N 7/00 | (2006.01) |
| G11C 11/16 | (2006.01) |
| G11C 14/00 | (2006.01) |
| G11C 5/08 | (2006.01) |
| G11C 7/10 | (2006.01) |
| G06N 99/00 | (2010.01) |

(52) U.S. Cl.
CPC ...... *G06F 13/1668* (2013.01); *G06F 13/1652* (2013.01); *G06N 7/005* (2013.01); *G11C 5/08* (2013.01); *G11C 7/1006* (2013.01); *G11C 11/16* (2013.01); *G11C 14/0081* (2013.01); *G06N 99/002* (2013.01); *G11C 2213/71* (2013.01)

(58) Field of Classification Search
None
See application file for complete search history.

(56) References Cited

U.S. PATENT DOCUMENTS

2013/0226540 A1* 8/2013 Pita ..................... G06F 17/5009
703/2
2014/0046626 A1    2/2014 Yamamoto et al.

FOREIGN PATENT DOCUMENTS

WO    2012118064 A1    9/2012

OTHER PUBLICATIONS

Byrnes et al., Optimization using Bose-Einstein condensation and measurement-feedback circuits, Feb. 19, 2013 (retrieved on Sep. 23, 2016), 10 pages.*

* cited by examiner

*Primary Examiner* — Gary W Cygiel
(74) *Attorney, Agent, or Firm* — Volpe and Koenig, P.C.

(57) ABSTRACT

In a semiconductor device which calculates an interaction model, a technique capable of executing interaction calculation in non-synchronization with a clock is provided. The semiconductor device includes a plurality of units each of which includes: a first memory cell for storing a value indicating a state of one node of an interaction model; a second memory cell for storing an interaction coefficient indicating an interaction from a node connected to the one node; and an interaction calculation circuit for determining a value indicating a next state of the one node based on a current determined by a value indicating a state of the connected node and the interaction coefficient.

13 Claims, 11 Drawing Sheets

SPIN UNIT 300

- ⬤ SPIN
- ▭ INTERACTION COEFFICIENT
- ☐ EXTERNAL MAGNETIC FIELD COEFFICIENT

SEMICONDUCTOR SYSTEM FOR IMPLEMENTING AN ISING MODEL OF INTERACTION

CROSS-REFERENCE TO RELATED APPLICATION

The present application claims priority from Japanese Patent Application No. 2014-176385 filed on Aug. 29, 2014, the content of which is hereby incorporated by reference into this application.

TECHNICAL FIELD OF THE INVENTION

The present invention relates to a semiconductor device. More particularly, the present invention relates to a semiconductor device to calculate an interaction model, and relates to an information processing device to control the semiconductor device as an accelerator.

BACKGROUND OF THE INVENTION

Currently, a mainstream of a computer architecture is a Neumann type. An operation of the Neumann-type architecture is defined by a program which is a sequential instruction string. The Neumann-type architecture has such general versatility as being available for various uses by changing the program. Not only a CPU (Central Processing Unit) that plays a central role of a computer but also a specific-use arithmetic device such as a GPU (Graphics Processing Unit) is configured of the Neumann-type architecture, and its basic operation is performed by sequentially executing the instruction string.

Until now, a performance of a computer has been improved mainly depending on improvement in a clock frequency. Since a foundation of the Neumann-type architecture is to sequentially execute the instruction string, the performance improvement can be expected by increasing an execution speed of an instruction. However, in a general-purpose CPU used for a personal computer or a server, the improvement in the clock frequency has peaked out at about 3 GHz in the early 2000s. In recent years, instead of the clock frequency which has peaked out, a method of achieving the performance improvement by parallel processing based on a multi core technique has become a mainstream.

In the parallel processing by the multi core technique, the performance improvement is achieved by finding out a parallel-executable part from the sequential instruction string (by extraction of parallelism), and performing the parallel execution. However, it is not easy to extract the parallelism from a program created by writing down the sequential algorithm as the instruction string. An ILP (Instruction Level Parallelism) which extracts the parallelism on an instruction level has already reached a limit, and a trend of use of the coarser-grain parallelism such as a TLP (Thread Level Parallelism) and a DLP (Data Level Parallelism) has appeared in recent years.

In consideration of such a situation, in order to achieve the performance improvement of the computer in the future, the execution of the sequential instruction string as conventional is not put on the basic technique, and it is required to shift the technique to an essentially parallel information processing. For that, instead of a problem description method by the conventional sequential instruction string, a problem description method suitable for achieving the essentially parallel information processing is required.

As its candidate, various physical phenomena and social phenomena can be expressed by an interaction model. The interaction model is a model defined by a plurality of nodes forming the model, an interaction between the nodes, and besides, a bias for every node as needed. Various models are proposed in physics or social sciences, and all of them can be interpreted as one aspect of the interaction model. In addition, as features of the interaction model, a point that an inter-node influence is limited to an interaction between two nodes (interaction between 2 bodies) is cited. For example, when dynamics of planets in cosmic space is considered, this model can be interpreted also as one type of the interaction model in a point that the interaction caused by universal gravity exists between the nodes which are the planes. However, inter-planet influence is not limited between two planets, and three or more planets affect each other, and exhibit complicated behaviors (which becomes a problem referred to as so-called three-body problem and many-body problem).

As an example of a typical interaction model in the field of physics, an Ising model can be cited. The Ising model is a model of statistical mechanics for describing behavior of a magnetic substance, and is used for research of the magnetic substance. The Ising model is defined as an interaction between sites (spins which take two values of +1/−1). It is known that acquirement of a ground state of the Ising model in which a topology has a non-plane graph is an NP-hard problem. In the Ising model, a problem is expressed by an interaction coefficient which is spread in a spatial direction, and therefore, there is a possibility of achievement of the information processing using the essential parallelism.

Incidentally, since the acquirement of the ground state of the Ising model is the NP-hard problem as described above, the solution by the Neumann-type computer is accompanied by a difficulty in view of computation time. While an algorithm for achieving the high speed by introducing heuristics is also proposed, a method of acquiring the ground state of the Ising model by using not the Neumann-type computer but a computation using physical phenomena more directly, that is, an analog computer has been proposed. For example, as such a device, a device described in International Publication No. WO/2012/118064 (Patent Document 1) is cited.

SUMMARY OF THE INVENTION

In the device as described in the Patent Document 1, parallelism for supporting a problem to be solved is required. Even in the case of the Ising model, a synchronous-type parallelism processing operated in synchronization with a clock is used in order to achieve an information processing using parallelism. Therefore, the interaction calculation of the Ising model is limited to the operation in synchronization with the clock, and therefore, it is desired that the interaction calculation can be executed in non-synchronization with the clock.

A typical object of the present invention is, in a semiconductor device for calculating the interaction model, to provide a technique capable of executing interaction calculation in non-synchronization with a clock.

The above and other objects and novel characteristics of the present invention will be apparent from the description of the present specification and the accompanying drawings.

The typical summary of the inventions disclosed in the present application will be briefly described as follows.

The typical semiconductor device includes a plurality of units each of which includes: a first memory cell for storing a value indicating a state of one node of an interaction model; a second memory cell for storing an interaction coefficient indicating an interaction from a node connected to the one node; and an interaction calculation circuit for determining a value indicating a next state of the one node based on a current defined by a value indicating a state of the connected node and the interaction coefficient.

More preferably, the interaction calculation circuit is controlled by an interaction signal enabling or disabling execution of the interaction.

The effects obtained by typical aspects of the invention disclosed in the present application will be briefly described below.

In a semiconductor device for calculating the interaction model, the typical effect can provide a technique capable of executing interaction calculation in non-synchronization with a clock.

BRIEF DESCRIPTIONS OF THE DRAWINGS

DESCRIPTIONS OF THE PREFERRED EMBODIMENTS

Figure 1:
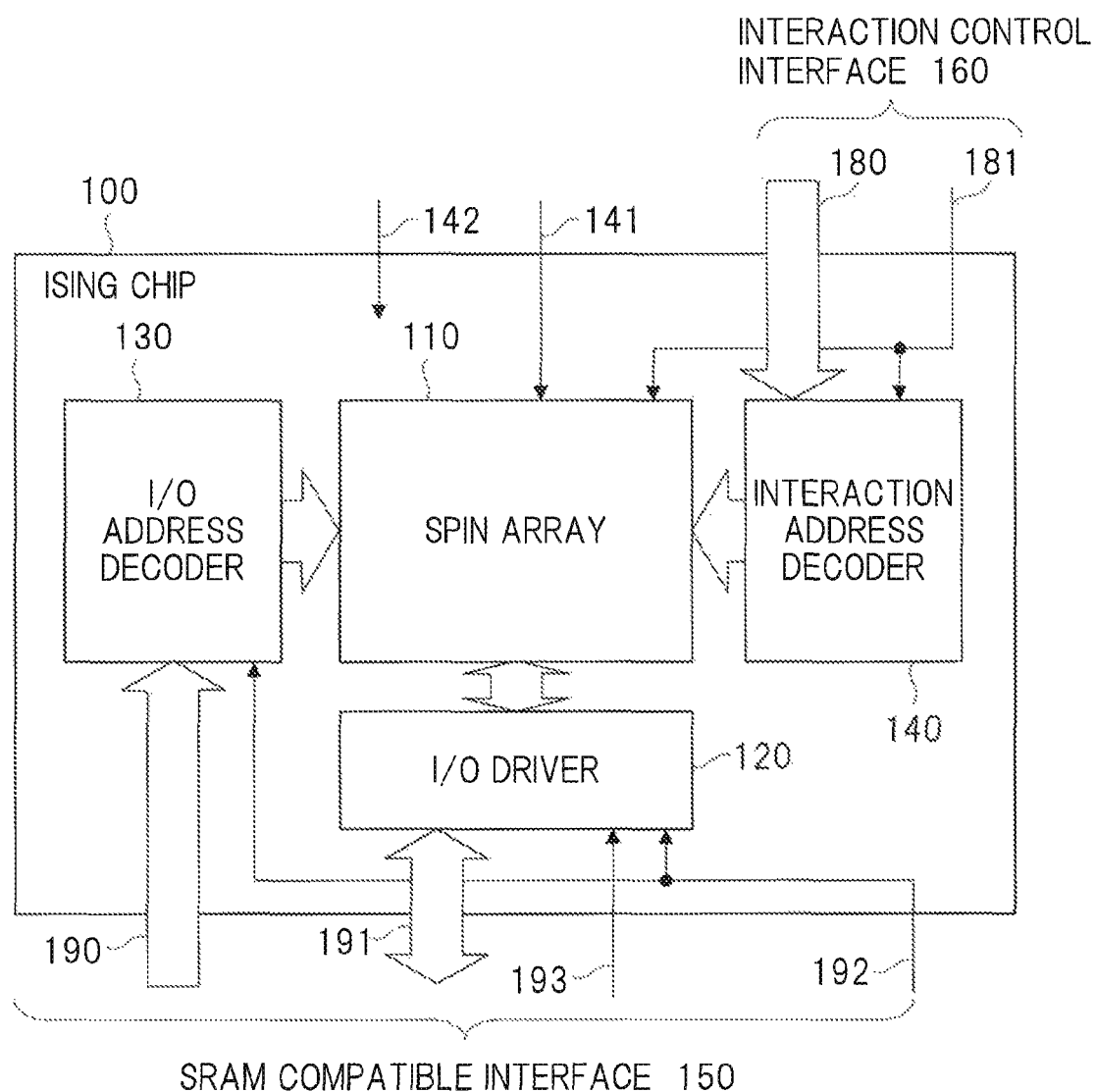
FIG. 1 is a diagram for explaining a configuration example of an Ising chip in an embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, numerical values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps or the like) are not always indispensable unless otherwise stated or except the case where the components are apparently indispensable in principle. Similarly, in the embodiments described below, when the shape of the components, positional relation thereof, and the like are described, the substantially approximate and similar shapes and the like are included therein unless otherwise stated or except the case where it is conceivable that they are apparently excluded in principle. The same goes for the numerical value and the range described above.

Hereinafter, an embodiment of the present invention will be described in detail based on the accompanying drawings. Note that the same components are denoted by the same or related reference symbols in principle throughout all the drawings for describing the embodiment, and the repetitive description thereof will be omitted. Further, in the embodiment described below, the explanation for the same or similar part is not repeated in principle unless otherwise particularly required.

Embodiment

The present embodiment relates to a semiconductor device which calculates an interaction model, and relates to an information processing device which controls the semiconductor device as an accelerator.

0. Definition of Interaction Model

Various physical phenomena and social phenomena can be expressed by an interaction model. The interaction model is a model defined by a plurality of nodes forming the model, an interaction among the nodes, and besides, a bias for every node as needed. While various models are proposed in physics or social sciences, all of them can be interpreted as one aspect of the interaction model. In addition, as a feature of the interaction model, an influence among the nodes is limited to an interaction between two nodes (interaction between two bodies). For example, when dynamics of planets in cosmic space is considered, this case can be interpreted also as one type of the interaction model in a point that an interaction caused by universal gravity is provided among nodes which are planets. However, the influence among the planets is not only limited between two planets, and three or more planets affect one another, and exhibit complicated behavior (which arises a problem referred to as so-called three-body problem or many-body problem).

As an example of a typical interaction model in the field of physics, an Ising model can be cited. As for the Ising model, the model is defined by an interaction coefficient which defines an interaction between two spins and an external magnetic field coefficient which is a bias for each spin while a spin which takes the spins having two states of +1/−1 (or, up/down, etc.) as the nodes. In addition, in the field of biology, a neural network obtained by modeling a brain is an example of the interaction model. In the neural network, while taking an artificial neuron obtained by simulating a neuron of a nerve cell as the node, such interaction as synapse connection is provided between the artificial neurons. In addition, a bias may be provided for every neuron in some cases. In the field of social sciences, when, for example, communication between human beings is considered, it can be understood easily that an interaction made by language or communication is provided while taking the node which is the human being. In addition, it can also be imagined that a bias is individually provided for each human being. Therefore, it has been studied to try clarifying characteristics of the communication between the human beings by simulating the communication between the human beings as an Ising model etc. which is common in a point of the interaction model.

The following is explanation for examples of an Ising chip 100 (FIG. 1) which is a semiconductor device used for acquiring the ground state of the Ising model, and an information processing device 200 (FIG. 2) which controls the Ising chip 100.

1. Conversion of Problem to be Solved Into a Ground-State Search Problem of the Ising Model The Ising model is a model of statistical mechanics for describing the behavior of the magnetic substance. The Ising model is defined by spins which have two states of 1/−1 (or, 0/1, or up/down), an interaction coefficient indicating an interaction between the spins, and an external magnetic field coefficient which is provided for every spin.

By the Ising model, from provided spin array, interaction coefficient and external magnetic field coefficient, energy at that time can be calculated. An energy function "E(σ)" of the Ising model is generally expressed by the following formula (1).

[Formula 1]

$$E(\sigma) = -\sum_{\langle i,j \rangle} J_{i,j} \sigma_i \sigma_j - \sum_i h_i \sigma_i \quad (1)$$

Note that it is assumed that "$\sigma_i$" and "$\sigma_j$" indicate values of the i-th and j-th spins, respectively, "$J_{i,j}$" indicates an interaction coefficient between the i-th and j-th spins, "$h_i$" indicates an external magnetic field coefficient with respect to the i-th spin, "<i, j>" indicates a combination of adjacent two sites, and "σ" indicates a spin array.

The acquisition of the ground state of an Ising model is an optimization problem to acquire a spin array which minimizes the energy function of the Ising model. For example, a problem having apparently no relation to the magnetic substance such as factorization problem and a traveling salesman problem can be converted into the Ising model. Then, the ground state of the Ising model acquired by the conversion corresponds to a solution of the original problem. From this, it can be said that a device which can search for the ground state of the Ising model is a computer which is available for a general-purpose use.

2. Configuration of Ising Chip

FIG. 1 is a diagram for explaining an example of a configuration of the Ising chip 100 in the present embodiment. The Ising chip 100 is configured of a spin array 110, an I/O (Input/Output) driver 120, an I/O address decoder 130, and an interaction address decoder 140. In the present embodiment, while the Ising chip 100 is explained in the assumption that the Ising chip 100 is mounted as a CMOS (Complementary Metal-Oxide Semiconductor) integrated circuit which is currently widely used, it can be achieved also by other solid-state element.

The Ising chip 100 has an SRAM compatible interface 150 for performing reading/writing to the spin array 110, and is configured of an address bus 190, a data bus 191, a R/W control line 193 and an I/O enable line 192. In addition, as an interaction control interface 160 for controlling the ground state search of the Ising model, the Ising chip 100 has an interaction address line 180 and an interaction enable line 181. While the Ising chip 100 is operated by a voltage supplied by a normal power supply line 142, a part of the spin array 110 is operated by a voltage supplied by a spin power supply line 141. Specifically, a memory cell which stores spin information among memory cells included in the spin unit 300 (FIG. 3) forming the spin array 110 is operated by a voltage supplied by the spin power supply line 141.

In the Ising chip 100, all of the spin $\sigma_i$, the interaction coefficient $J_{i,j}$ and the external magnetic field coefficient $h_i$ of the Ising model are expressed by information stored in the memory cell in the spin array 110. The reading/writing of the spin σi are performed by the SRAM compatible interface 150 in order to set an initial state of the spin σi and read the solution after completion of the ground state search. In addition, in order to set the Ising model whose ground state is to be searched to the Ising chip 100, the reading/writing of the interaction coefficient $J_{i,j}$ and the external magnetic field coefficient $h_i$ are also performed by the SRAM compatible interface 150. Therefore, an address is provided to the spin $\sigma_i$, the interaction coefficient $J_{i,j}$ and the external magnetic field coefficient $h_i$ in the spin array 110.

In the present embodiment, the address bus 190, the data bus 191, and the R/W control line 193 which configure the SRAM compatible interface 150 are operated in accordance with an enable signal inputted to the I/O enable line 192.

In addition, in the Ising chip 100, the interaction between the spins is achieved inside the spin array 110 for performing the ground state search. A unit for controlling this interaction from the outside is the interaction control interface 160. Specifically, an address for specifying a spin group which performs the interaction is inputted via the interaction address line 180, and the interaction is performed in accordance with an enable signal inputted via the interaction enable line 181. This enable signal is a signal which enables the execution of the interaction.

3. Configuration of Information Processing Device

In order to achieve the information processing by using one or a plurality of the Ising chips 100 described above, it is required to control the interface as described above. Therefore, the Ising chip 100 is used as a part of the information processing device 200 as illustrated in FIG. 2.

Figure 2:
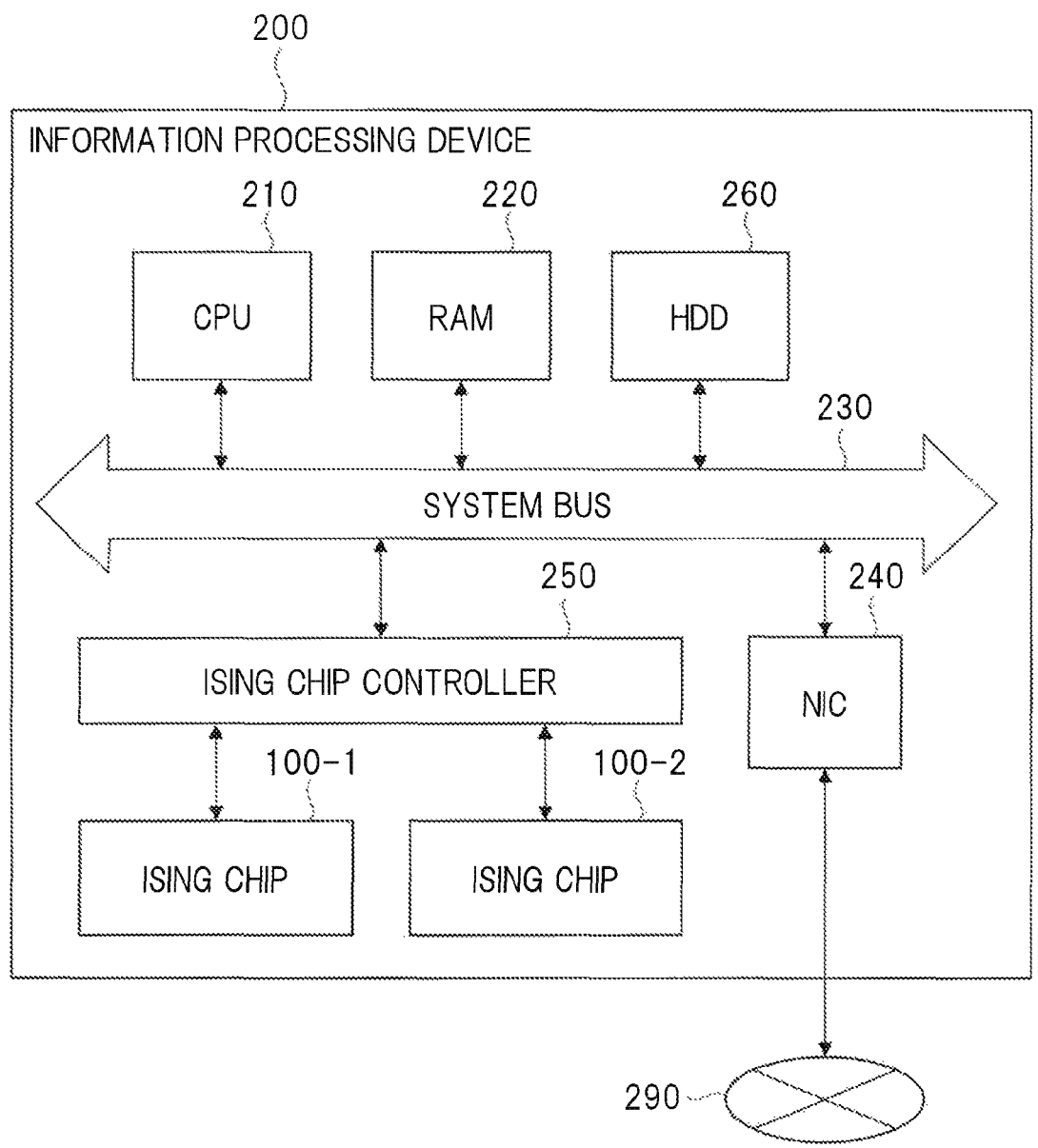
FIG. 2 is a diagram for explaining a configuration example of an information processing device in an embodiment of the present invention.

FIG. 2 is a diagram for explaining a configuration example of the information processing device 200 in the present embodiment. The information processing device 200 may be considered to be a unit obtained by attaching an accelerator configured of the Ising chip 100 to a device such as a personal computer and a server which are currently generally used. The information processing device 200 has a CPU (Central Processing Unit) 210, a RAM (Random Access Memory) 220, a HDD (Hard Disk Drive) 260, and a NIC (Network Interface Card) 240, etc., and they are coupled by a system bus 230. This is a configuration generally seen in the current personal computer and the server.

In addition, an Ising chip controller 250 is connected to the system bus 230, and one or a plurality of Ising chips are provided beyond the Ising chip controller (in an example of FIG. 2, two Ising chips 100-1 and 100-2 are provided. Hereinafter, they are simply referred to as the Ising chip 100 when it is not particularly required to distinguish the two Ising chips from each other). The Ising chip controller 250 and the Ising chip 100 correspond to the accelerator, and take such a mode as an expansion card inserted into a peripheral-expansion interface such as a PCI Express. The Ising chip controller 250 is a unit for converting a protocol of the system bus 230 (such as the PCI Express and a QPI) in accordance with an interface of the Ising chip 100.

Software which operates on the CPU 210 of the information processing device 200 can control the Ising chip 100 via the Ising chip controller 250 generally by performing the reading/writing to/from a specific address. In addition, a plurality of such information processing devices 200 may be coupled via an inter-device network 290 for use.

The information processing device 200 achieves the ground state search of the Ising model by the control of the Ising chip controller 250 by the CPU 210 and the control of the SRAM compatible interface 150 and the interaction control interface 160 of the Ising chip 100 by the Ising chip controller 250.

4. Configuration of Spin Array

Figure 3:
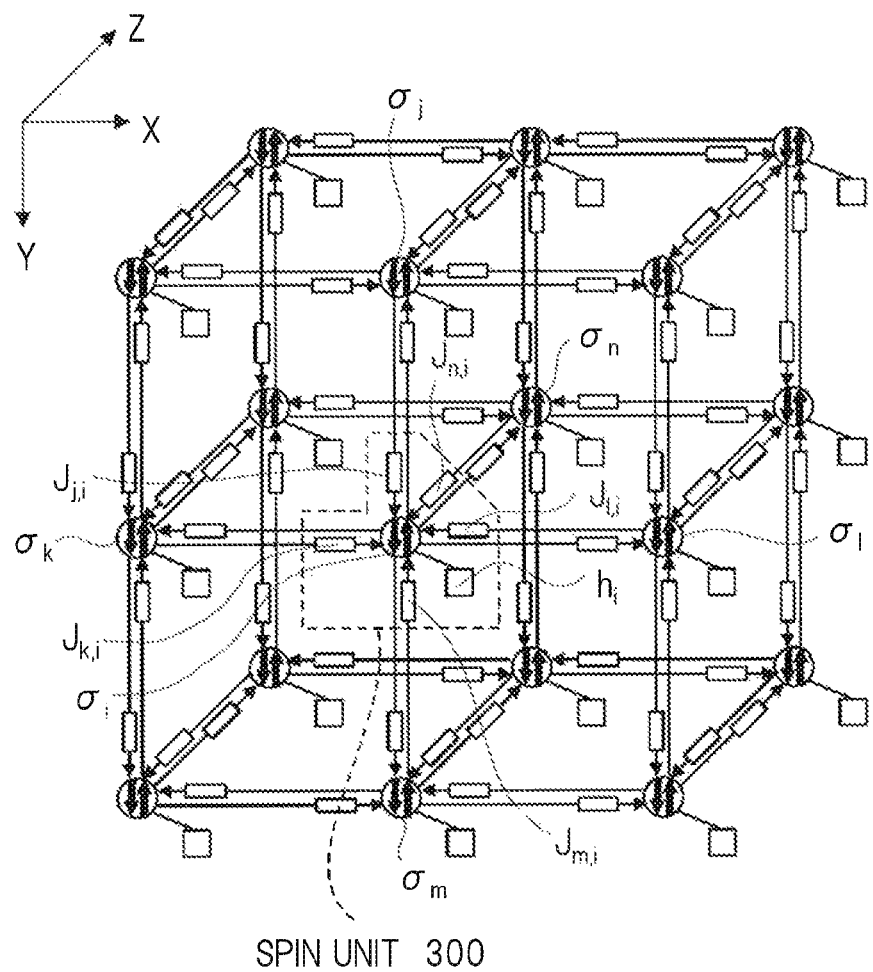
FIG. 3 is a diagram for explaining a configuration example of a spin array having a three-dimensional lattice in an embodiment of the present invention.

The spin array 110 is configured by arranging a lot of spin units 300 as a basic configuration unit each of which achieves to store one spin and the interaction coefficient and the external magnetic field coefficient which accompany the spin and to perform a processing of the ground state search. FIG. 3 is a diagram for explaining a configuration example of the spin array 110 having a three-dimensional lattice. FIG. 3 shows an example in which the Ising model having a three-dimensional lattice-shaped topology is configured by arranging a plurality of spin units 300. The example of FIG. 3 shows a three-dimensional lattice having a size of "3 (X-axial direction)×3 (Y-axial direction)×2 (Z-axial direction)". As shown in the drawing, the coordinate axes are defined so that a right direction in the drawing is an X-axis, a downward direction in the drawing is a Y-axis, and a depth direction in the drawing is a Z-axis. However, the coordinate axes are only required for convenience in the explanation of the embodiment, and has no relation to the present invention. When a topology other than the topology having the three-dimensional lattice, such as a tree-shaped topology, is used, the topology is expressed by the number of steps of the tree, etc. apart from the coordinate axis. In the three-dimensional lattice-shaped topology of FIG. 3, when the interaction between the spins is taken as a graph, a five-order spin (peak) at the maximum is required. In consideration of including also the connection of the external magnetic field coefficient, note that the order is required to be six at the maximum.

In one spin unit 300 shown in FIG. 3, values of adjacent spins (in a case of, for example, adjacent five spins) $\sigma_j$, $\sigma_k$, $\sigma_l$, $\sigma_m$ and $\sigma_n$ are inputted. Also, in addition to the spin $\sigma_i$ and the external magnetic field coefficient $h_i$, the spin unit 300 has a memory cell for storing $J_{j,i}$, $J_{k,i}$, $J_{l,i}$, $J_{m,i}$, $J_{n,i}$ which are interaction coefficients with the above-described adjacent spin $\sigma_i$ (interaction coefficients with the adjacent five spins).

Incidentally, the Ising model has an interaction generally expressed by an undirected graph. The above-described formula (1) includes "$J_{i,j} \times \sigma_i \times \sigma_j$" as a term indicating the interaction, and this term indicates the interaction caused from the i-th spin to the j-th spin. At this time, in the general Ising model, the interaction caused from the i-th spin to the j-th spin is not distinguished from the interaction caused from the j-th spin to the i-th spin. That is, "$J_{i,j}$" and "$J_{j,i}$" are the same as each other. However, in the Ising chip 100 of the present embodiment, the interaction caused from the i-th spin to the j-th spin and the interaction caused from the j-th spin to the i-th spin are made asymmetric to each other by expanding this Ising model so as to have a directed graph. In this manner, an expression ability of the model increases, so that many problems can be expressed by a smaller-scale model.

Therefore, when one spin unit 300 is considered to be the i-th spin $\sigma_i$, the interaction coefficients $J_{j,i}$, $J_{k,i}$, $J_{l,i}$, $J_{m,i}$, $J_{n,i}$ which are the interaction coefficients stored in this spin unit determine the interaction caused from the j-th, k-th, l-th, m-th and n-th adjacent spins $\sigma_j$, $\sigma_k$, $\sigma_l$, $\sigma_m$ and $\sigma_n$ to the i-th spin $\sigma_i$. This corresponds to the fact that an arrow (interaction) corresponded from the interaction coefficient stored in the shown spin unit 300 is directed from an external spin of the shown spin unit 300 to an internal spin of the spin unit 300 in FIG. 3.

5. Correspondence Relation Between Topology of Spin Array and Memory Cell in Spin Unit An example of the configuration of the spin unit 300 will be explained by using FIG. 6. In order to store the spin $\sigma_i$ of the Ising model, the interaction coefficient $J_{j,i}$ to $J_{n,i}$ and the external magnetic field coefficient $h_i$, the spin unit 300 has a plurality of 1-bit memory cells N, IS0, IS1, IU0, IU1, IL0, IL1, IR0, IR1, ID0, ID1, IF0 (omitted in the drawing), and IF1 (omitted in the drawing). Note that the memory cells IS0 and IS1, the memory cells IU0 and IU1, the memory cells IL0 and IL1, the memory cells IR0 and IR1, the memory cells ID0 and ID1, and the memory cells IF0 and IF1 omitted in the drawing play a role as a pair of two memory cells, respectively, and therefore, they are collectively abbreviated as a memory cell pair ISx, IUx, ILx, IRx, IDx or IFx, respectively (see FIG. 4). The following will be the explanation also including the memory cells omitted in the drawing.

Figure 7:
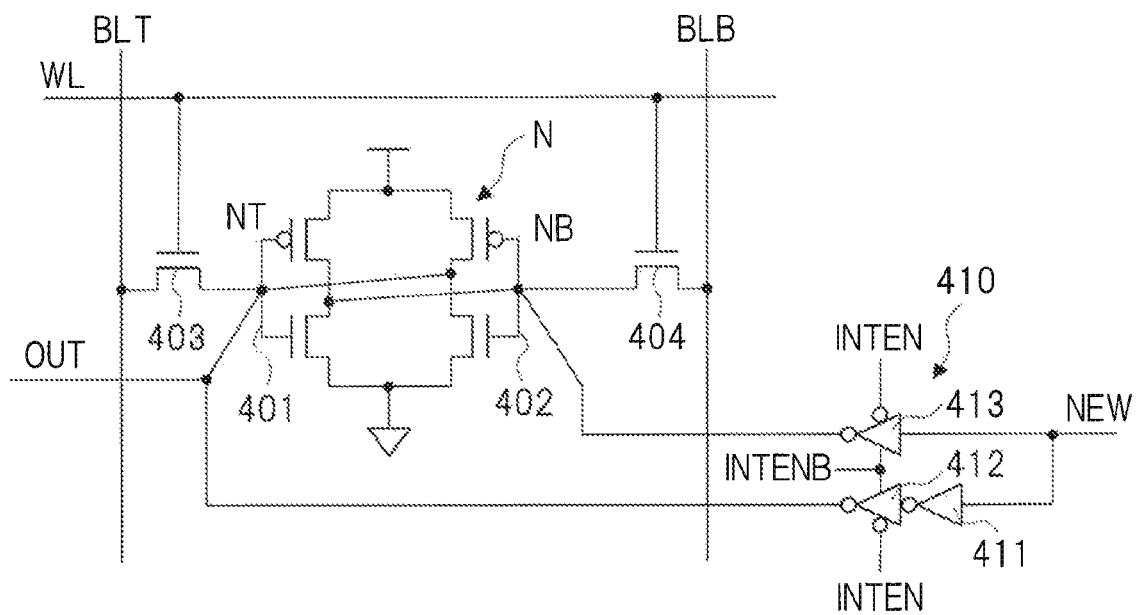
FIG. 7 is a diagram for explaining an example of a circuit configuration of a circuit for writing a value of a spin into a memory cell in the spin array of the Ising chip of FIG. 1.

Each of memory cells N, IS0, IS1, IU0, IU1, IL0, IL1, IR0, IR1, ID0, ID1, IF0 and IF1, which are included in the spin unit 300, has a data storing unit configured of two CMOS inverters as similar to an SRAM, and pass gate transistors each connected to the both ends of the data storing unit are controlled by a word line and a bit line, so that data reading/writing from/to the data storing unit are achieved (a circuit configuration of the memory cell N is shown in FIG. 7 described later).

Here, the explanation will be made based on the assumption that the spin unit 300 expresses the i-th spin. The memory cell N is a memory cell for expressing the spin $\sigma i$, and stores a value of the spin. In the Ising model, the values of the spin are +1/−1 (+1 is also expressed as upside, and −1 is also expressed as downside), and the values are corresponded to 0/1 which are two values of the memory cell. For example, +1 is corresponded to 1, and −1 is corresponded to 0.

Figure 4:
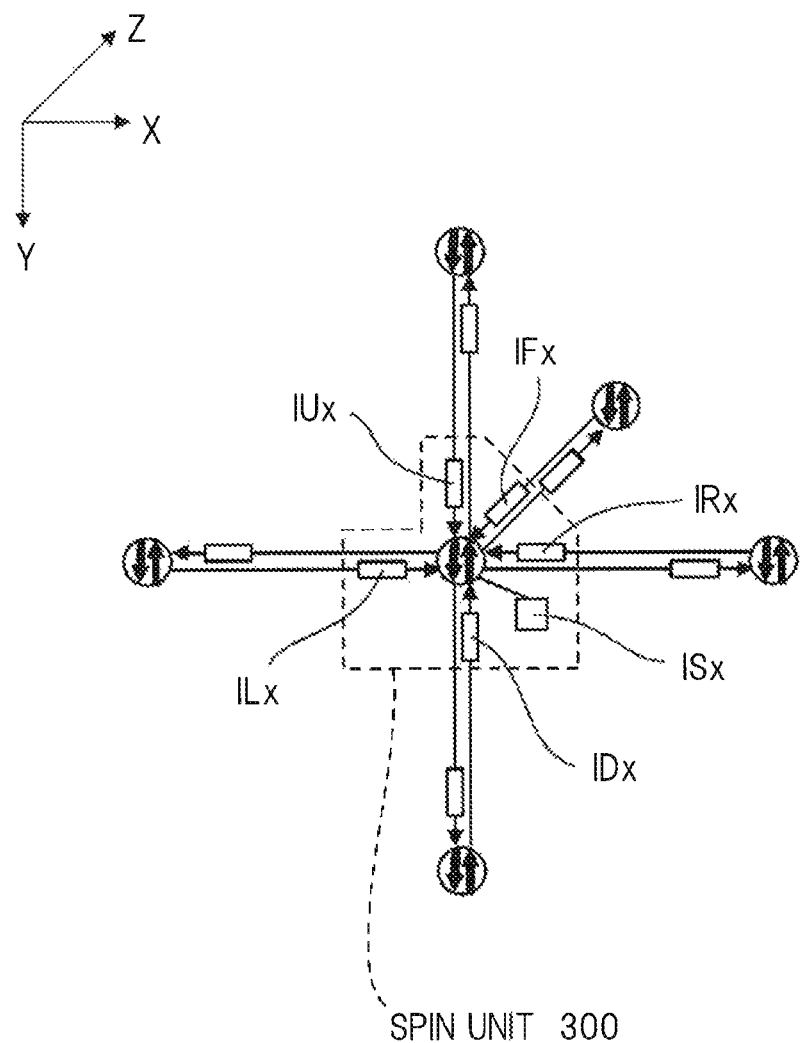
FIG. 4 is a diagram for explaining an example of a correspondence relation between a topology of the spin array and a memory cell in a spin unit in an embodiment of the present invention.

By using FIG. 4, an example of correspondence relations between the memory cell pairs ISx, IUx, ILx, IRx, IDx and IFx which are included in the spin unit 300 and the topology of the Ising model shown in FIG. 3 are shown. The memory cell pair ISx stores an external magnetic field coefficient. In addition, each of the memory cell pairs IUx, ILx, IRx, IDx and IFx stores an interaction coefficient. Specifically, the memory cell pairs IUx, ILx, IRx, IDx, and IFx stores interaction coefficients $J_{i,j}$ with an upside spin (−1 in the Y-axis direction), a left-side spin (−1 in the X-axis direction), a right-side spin (+1 in the X-axis direction), a downside spin (+1 in the Y-axis direction), and a depth-direction coupled spin (+1 or −1 in the Z-axis direction), respectively.

In addition, in the case of taking the Ising model as the directed graph, when viewed from a certain spin, other spin has a coefficient having the influence on the own spin. The coefficient of the influence of the own spin on the other spin belongs to other spin. That is, this spin unit 300 is coupled with five spins at the maximum. In the Ising chip 100 of the present embodiment, three values of +1/0/−1 correspond to the external magnetic field coefficient and the interaction coefficient. Therefore, in order to express the external magnetic field coefficient and the interaction coefficient, each of them requires a memory cell of 2 bits. For the memory cell pairs ISx, IUx, ILx, IRx, IDx and IFx, the three values of +1/0/−1 are expressed by a combination of two memory cells each of which has a last number of 0 or 1 (for example, memory cells IS0 and IS1 in the case of the memory cell pair ISx).

For example, for the memory cell pair ISx, +1/−1 is expressed by the memory cell IS1 so that +1 is expressed when the value stored in the memory cell IS1 is 1, and −1 is expressed when the value stored in the memory cell IS1 is 0. In addition to this, the external magnetic field coefficient is regarded as 0 when the value stored in the memory cell IS0 is 0, or either of +1/−1 determined by the value stored in the memory cell IS1 is set to the external magnetic field coefficient when the value stored in the memory cell IS0 is 1. If the case of the external magnetic field coefficient of 0 is considered to disable the external magnetic field coefficient, it can be said that the value stored in the memory cell IS0 is an enabling bit of the external magnetic field coefficient (when IS0=1, the external magnetic field coefficient is enabled). Also for the memory cell pairs IUx, ILx, IRx, IDx and IFx which store the interaction coefficients, the coefficients and the bit values are corresponded to each other.

Each of the memory cells N, IS0, IS1, IU0, IU1, IL0, IL1, IR0, IR1, ID0, ID1, IF0 and IF1 in the spin unit 300 has to be capable of reading/writing from/to the outside of the Ising chip 100. Therefore, the spin unit 300 has each of a bit line and a word line not shown. The spin units 300 are arranged in a tiled pattern on a semiconductor substrate, and are driven, controlled or read by the I/O address decoder 130 and I/O driver 120 shown in FIG. 1 with connecting the bit line and the word line, so that the memory cells in the spin unit 300 can be read/written by the SRAM-compatible interface 150 of the Ising chip 100 as similar to a general SRAM (Static Random Access Memory).

6. Circuit for Determining Next State of Spin in Spin Unit

In the spin unit 300, in order to perform updating simultaneously, every spin unit 300 independently has a circuit for determining a next spin state by calculating the interaction. The circuit for determining the next state of the spin is shown in FIG. 6.

Figure 6:
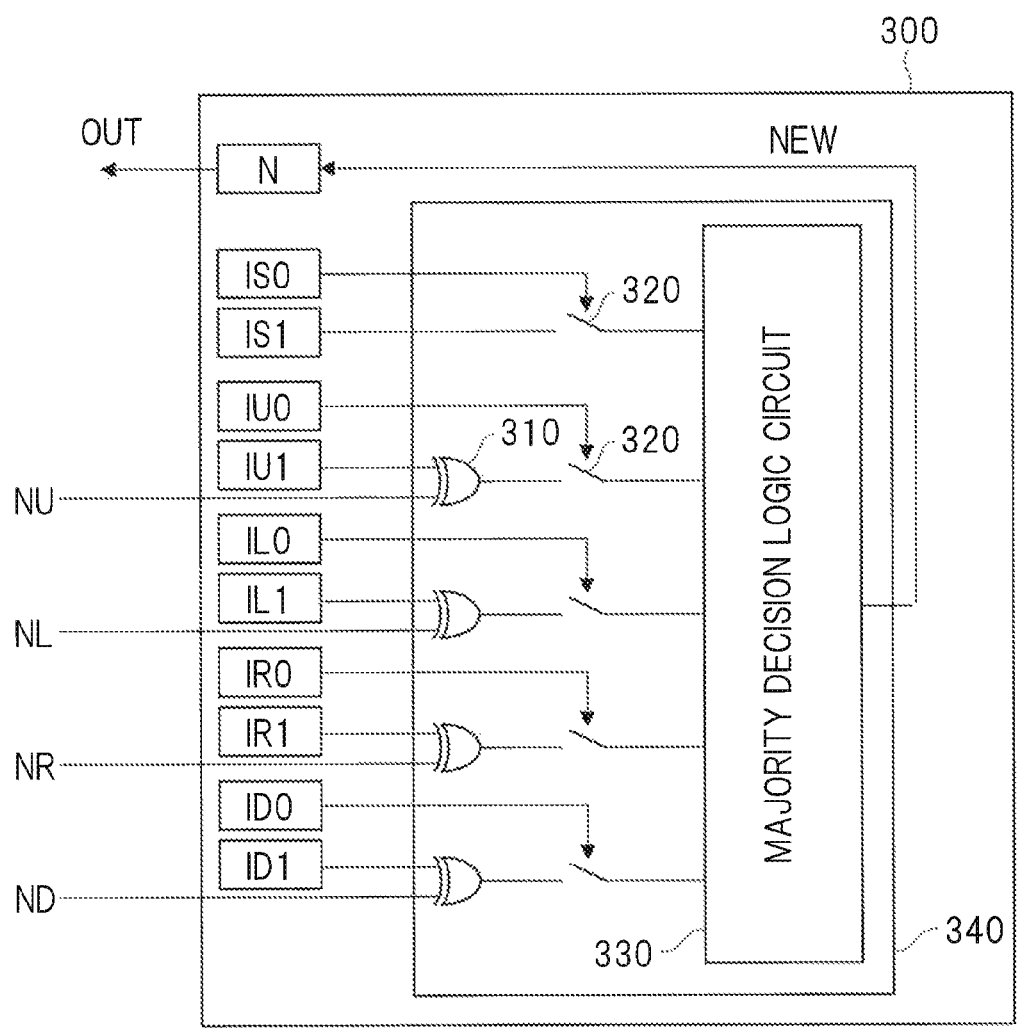
FIG. 6 is a diagram for explaining an example of a configuration of a spin unit in the spin array of the Ising chip of FIG. 1.

In FIG. 6, the spin unit 300 has signal lines NU, NL, NR, ND, NF (omitted in the drawing) and OUT(N) as interfaces with the outside. Hereinafter, the explanation will be made so as to also include the signal lines omitted in the drawing.

The signal line OUT(N) is an interface to output a value of the spin of this spin unit 300 to other spin unit 300. The signal lines NU, NL, NR, ND and NF are interfaces each of which inputs a value of a spin stored in other spin unit 300. The signal line NU takes an input from an upside spin (−1 in the Y-axis direction), the signal line NL takes an input from a left-side spin (−1 in the X-axis direction), the signal line NR takes an input from a right-side spin (−1 in the X-axis direction), the signal line ND takes an input from a downside spin (+1 in the Y-axis direction), and the signal line NF takes an input from a depth-direction coupled spin (+1 or −1 in the Z-axis direction).

For these interfaces, it is required to determine handling of an edge in consideration of the topology of the Ising model. If the edge is simply cut off as similar to the topology of FIG. 3, it is not required to input anything to the signal line corresponding to the edge among the signal lines NU, NL, NR, ND and NF (on the circuit, such a suitable handling as using an unused input terminal by connection to a fixed value of 0 or 1 is taken).

In the spin unit 300, the next state of the spin is determined so as to minimize energy with the adjacent spin, and this determination is equivalent to the determination of which one of a positive value and a negative value is dominant when a product between the adjacent spin and the interaction coefficient and the external magnetic field coefficient are observed. For example, when the spin $\sigma_j$, $\sigma_k$, $\sigma_l$, $\sigma_m$ and $\sigma_n$ are adjacent to the i-th spin $\sigma_i$, the next state of the spin $\sigma_i$ is determined as follows. First, it is assumed that the values of the adjacent spins are expressed as $\sigma_j=+1$, $\sigma_k=-1$, $\sigma_l=+1$, $\sigma_m=-1$ and $\sigma_n=+1$, that the interaction coefficients are expressed as $J_{j,i}=+1$, $J_{k,i}=+1$, $J_{l,i}=+1$, $J_{m,i}=-1$ and $J_{n,i}=-1$, and that the external magnetic field coefficient is expressed as $h_i=+1$. At this time, when each of the product between the interaction coefficient and the adjacent spin, and the external magnetic field coefficient is arranged, they are expressed as $\sigma_j \times J_{j,i}=+1$, $\sigma_k \times J_{k,i}=-1$, $\sigma_l \times J_{l,i}=+1$, $\sigma_m \times J_{m,i}=+1$, $\sigma_n \times J_{n,i}=-1$, and $h_i=+1$. The external magnetic field coefficient may be interpreted as an interaction coefficient with a spin whose value is always +1.

Here, a local energy between the i-th spin and the adjacent spin becomes a value obtained by multiplying the value of the i-th spin with the above-described coefficient, and besides, by inverting a sign. For example, a local energy between the i-th spin and the j-th spin becomes −1 when the i-th spin is +1, and becomes +1 when the i-th spin is −1, and therefore, the setting of the i-th spin to be +1 acts in a direction of decrease in the local energy here. When such a local energy between the i-th spin and all the adjacent spins and with respect to the external magnetic field coefficient is considered, the calculation is performed for which one of +1 and −1 as the value of the i-th spin can decrease the energy. This calculation is performed by counting which one of +1 and −1 is more than the other in the arrangement of each of the above-described product between the interaction coefficient and the adjacent spin and the external magnetic field coefficient. In the above-described example, the number of +1 is 4, and the number of −1 is 2. The sum total of the energy becomes −2 if the i-th spin is +1, and the sum total of the energy becomes +2 if the i-th spin is −1. Therefore, such a next state of the i-th spin as minimizing the energy can be determined by majority decision that the next state of the i-th spin is set to +1 if the number of +1 is larger, and the next state of the i-th spin is set to −1 if the number of −1 is larger.

A logic circuit shown in the spin unit 300 of FIG. 6 is a circuit for calculating the interaction described above. First, an exclusive disjunction (OR) operation of the state of the adjacent spin and the value stored in each of the memory cells IU1, IL1, IR1, ID1 and IF1 (omitted in the drawing) which indicate +1/−1 of the interaction coefficient is obtained by an exclusive OR circuit 310. In this manner, when only the interaction is seen, the next state of the spin which minimizes the energy can be calculated (it is assumed that +1 is encoded as 1 and that −1 is encoded as 0). If the interaction coefficient is only +1/−1, the next state of the spin can be determined by judging which one of +1 and −1 of outputs of the exclusive OR circuit 310 is more than the other by the majority decision logic in the majority decision logic circuit 330. When the external magnetic field coefficient is always regarded so as to correspond to the interaction coefficient with the spin of state +1, a value of the external magnetic field coefficient is simply a value to be inputted into the majority decision logic circuit 330 for determining the next state of the spin.

In a configuration of the spin unit 300 shown in FIG. 6, the exclusive OR circuit 310, a switching circuit 320 and the majority decision logic circuit 330 are referred to as an interaction calculation circuit 340 as a whole.

The ground state of the applied Ising model can be searched by the above-described minimization of the energy caused by the interaction between the spins. However, there is a possibility falling into a local optimum solution by using only this manner. Basically, there is only a motion in a direction of the decrease in the energy, and therefore, once the search is fallen into the local optimum solution, the solution cannot be got out from that, and the search cannot reach a global optimum solution. Therefore, as action for escaping from the local optimum solution, a method of stochastically inverting the value of the memory cell which expresses the spin is also used.

7. Configuration of Spin Unit in Spin Array

Figure 5:
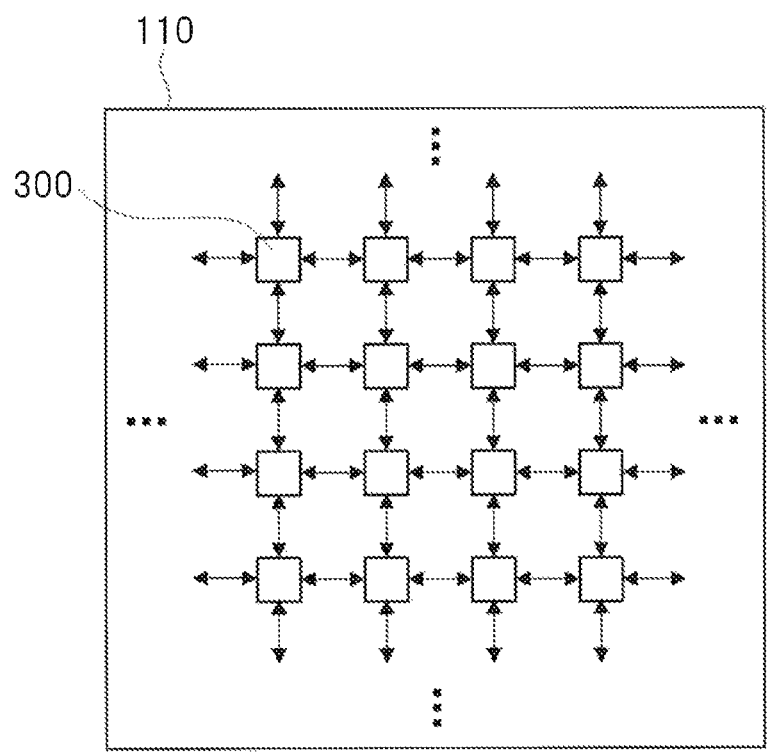
FIG. 5 is a diagram for explaining an example of an interaction caused by a spin unit of a configuration unit in the spin array of the Ising chip of FIG. 1.

FIG. 5 is a diagram for explaining an example of the interaction based on the spin unit 300 of the configuration unit in the spin array 110. FIG. 5 shows the spin array 110 configured so that a plurality of spin units 300 are arranged and connected in a two-dimensional plane on a semiconductor substrate while maintaining a topology of the Ising model. That is, in the spin array 110, the plurality of spin units 300 each of which is assigned with each spin of the Ising model having the three-dimensional lattice-shaped topology shown in FIG. 3 are arranged and connected in a two-dimensional lattice shape on the semiconductor substrate.

As an example of FIG. 5, in the spin array 110, each spin unit 300 is coupled with the adjacent spin unit which interacts therewith. Specifically, when attention is focused on one certain spin unit 300, this spin unit is coupled with each of the upside spin unit, the left-side spin unit, the right-side spin unit and the downside spin unit. By such a coupling, in each spin unit 300, the value of the spin in the own spin unit is outputted from the own spin unit to each adjacent spin unit. In addition, in each spin unit 300, the value of the spin in each adjacent spin unit is inputted from each adjacent spin unit to the own spin unit.

8. Configuration of Spin Unit

FIG. 6 is a diagram for explaining an example of the configuration of the spin unit 300. The spin unit 300 includes: the memory cell N for storing the value of one spin of the Ising model; the memory cells IU0, IU1, IL0, IL1, IR0, IR1, ID0, and ID1 (and others IF0 and IF1 which are omitted in the drawing) for storing the interaction coefficient from the adjacent spin which interacts with one spin; the memory cells IS0 and IS1 for storing the external magnetic field coefficient of one spin; and the interaction calculation circuit 340 for determining the next state of one spin by the majority decision logic based on the two values in the product between the value of each adjacent spin and the interaction coefficient corresponding to this value and in the external magnetic field coefficient.

The interaction calculation circuit 340 includes the exclusive OR circuit 310, the switch circuit 320, and the majority decision logic circuit 330, and is configured to include an analog circuit. In the interaction calculation circuit 340, the interaction is calculated by the exclusive OR circuit 310, the switch circuit 320, and the majority decision logic circuit 330, based on the interaction coefficients (IU0, IU1, IL0, IL1, IR0, IR1, ID0, and ID1, and IF0 and IF1 which are omitted in the drawing) and the external magnetic field coefficients (IS0 and IS1) stored in the memory cell in the own spin unit 300, and on the spin values (NU, NL, NR, and ND, and NF which is omitted in the drawing) from the adjacent spin unit 300, so that the next state of the spin in the own spin unit 300 is determined. A value (NEW) of the next state of the spin is written in the memory cell N. In addition, the value of the spin written in the memory cell N is outputted to the adjacent spin unit (OUT).

Details of a function in this interaction calculation circuit 340 are as described in the section <6. Circuit for determining next State of spin in spin unit> described above. In addition, a circuit configuration and a circuit operation of this interaction calculation circuit 340 will be described later.

9. Circuit for Writing Value of Spin Into Memory Cell of Spin

Figure 8:
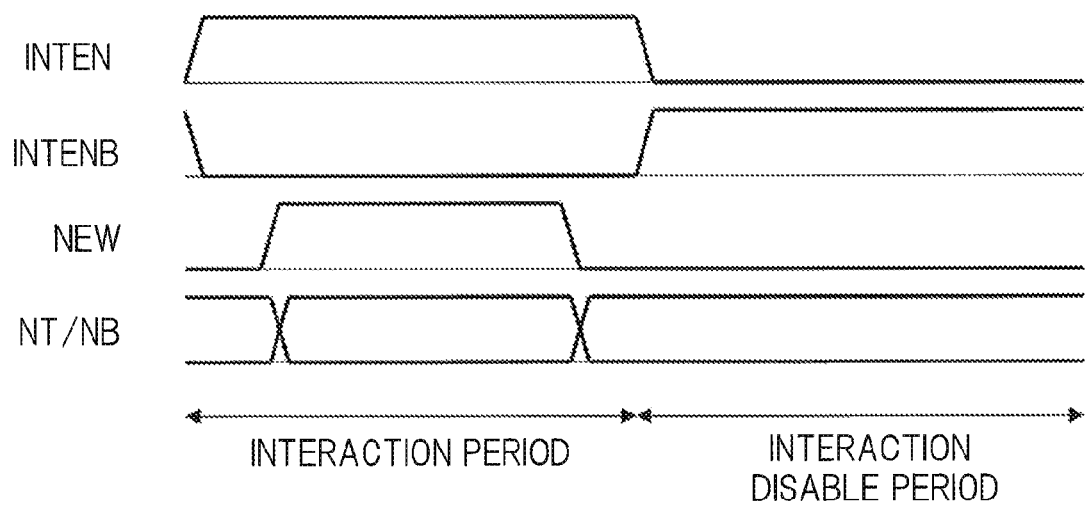
FIG. 8 is a diagram for explaining an example of an operation waveform in the circuit of FIG. 7.

FIGS. 7 and 8 are diagrams for explaining an example of a circuit for writing a value of a spin into the memory cell N. FIG. 7 shows an example of the memory cell N of the spin and a circuit configuration of the circuit for writing the value of the spin into the memory cell N. FIG. 8 shows an example of an operation waveform in the circuit of FIG. 7.

As shown in FIG. 7, the memory cell N for storing the value of the spin is configured of the pair of cross-coupled CMOS inverters 401 and 402 and the pass gate transistors 403 and 404 connected to nodes NT and NB of this pair of CMOS inverters as similar to an SRAM. As for the pair of CMOS inverters 401 and 402, mutually, a gate of one of them is connected to an output of the other, and an output of one of them is connected to a gate of the other. The gates of the pair of CMOS inverters 401 and 402 become the storage nodes NT and NB, respectively. The pass gate transistors 403 and 404 are connected between the storage node NT and the bit line BLT and between the storage node NB and the bit line BLB, respectively, and the gates are connected to the word line WL.

The writing circuit 410 for writing the value of the spin into this memory cell N is configured by connecting the series-connected circuit of the inverter 411 and the clocked inverter 412 in parallel with the clocked inverter 413 while taking the spin value NEW as the input. In this parallel connection, the series-connected circuit of the inverter 411 and the clocked inverter 412 is connected to the storage node NT, and the clocked inverter 413 is connected to the storage node NB. The clocked inverters 412 and 413 are controlled by complementary interaction signals (an interaction signal INTEN and an inverted interaction signal INTENB obtained by inverting the interaction signal) which enable or disable the execution of the interaction. This writing circuit 410 is included in the interaction calculation circuit 340.

In the circuit configuration shown in FIG. 7, data of 1 bit is stored in the storage nodes NT and NB by using the pair of cross-coupled CMOS inverters 401 and 402. When the data of the memory cell N of the spin is read/written from/to the outside of the chip, the word line WL and the bit lines BLT and BLB are used.

Meanwhile, when the interaction is calculated in the spin unit 300, the data is written into the spin unit 300. The new data is inputted from the NEW, and is controlled by the interaction signals INTEN and INTEB. A detailed operation waveform is shown in FIG. 8. An interaction period is a period obtained when the interaction signal INTEN is high and the inverted interaction signal INTENB is low. During the calculation of the interaction, the value of the NEW is transmitted to the storage nodes NT and NB as it is. Therefore, in the interaction period, the value of the NEW changes, and the value of the spin (memory cell N) changes. In addition, in an interaction disable period when the interaction is disabled, the interaction signal INTEN is disabled (is to be low).

In addition, the value of the spin written into the memory cell N is outputted from the storage node NT of the memory cell N to the adjacent spin unit (OUT).

Figure 9:
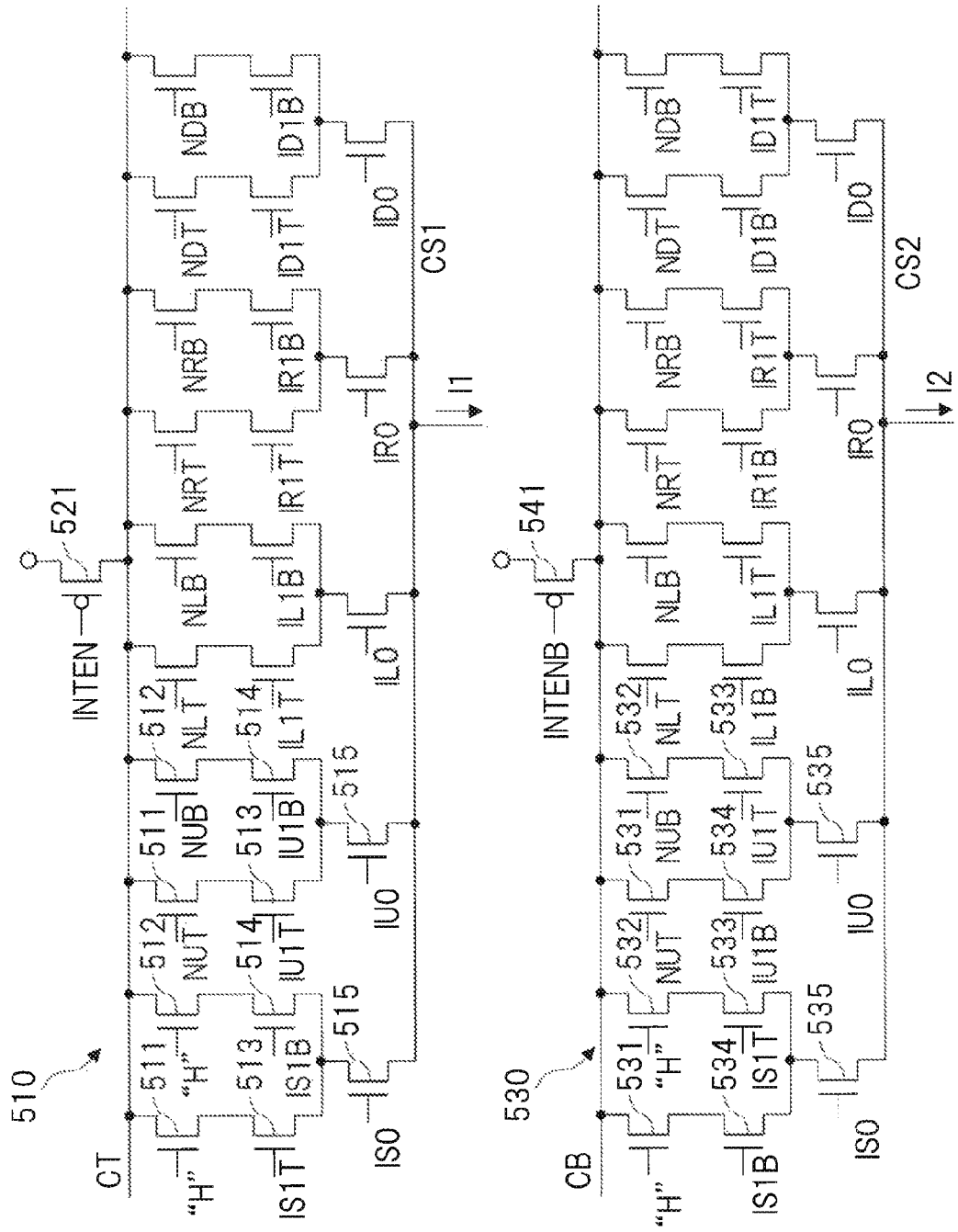
FIG. 9 is a diagram for explaining an example of a circuit configuration of an interaction calculation circuit (circuit for adding a current of majority decision logic) in the spin array of the Ising chip of FIG. 1.
Figure 10:
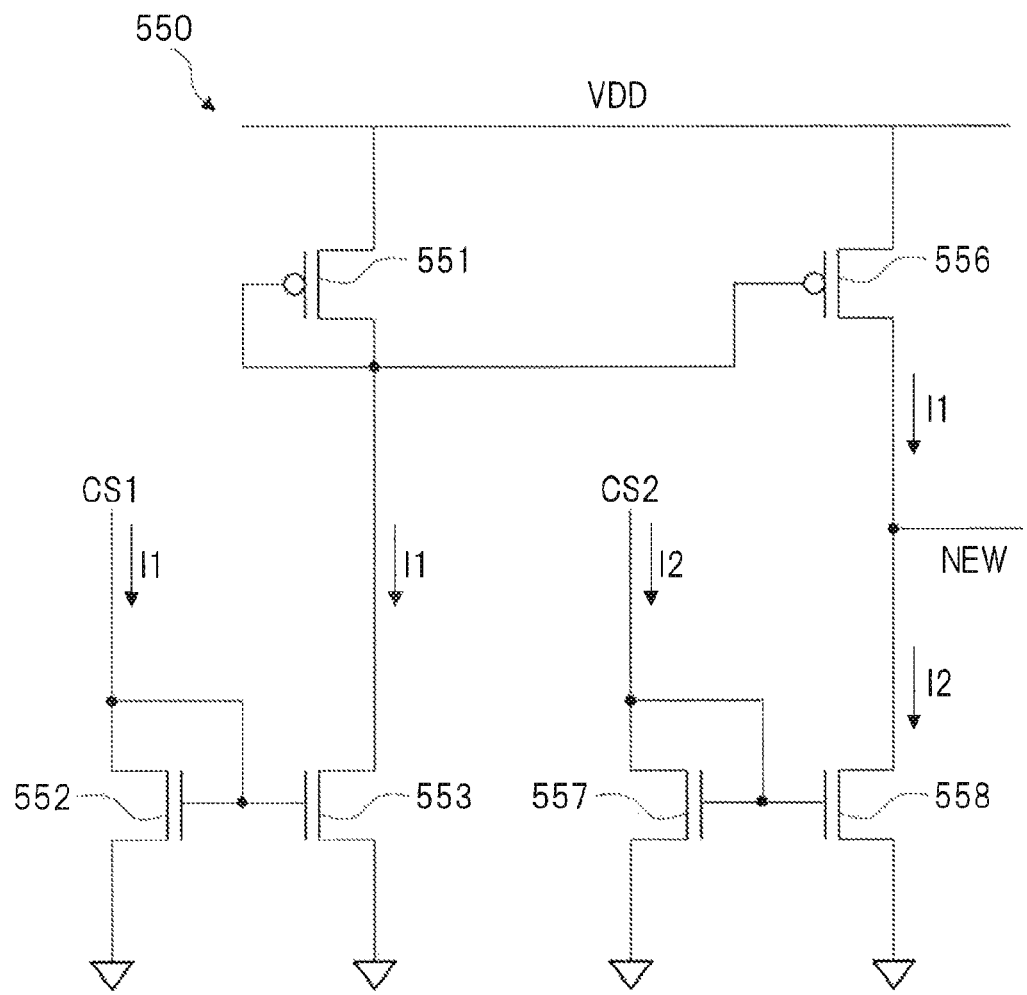
FIG. 10 is a diagram for explaining an example of a circuit configuration of an interaction calculation circuit (circuit for comparing the added current in FIG. 9) in the spin array of the Ising chip of FIG. 1.
Figure 11:
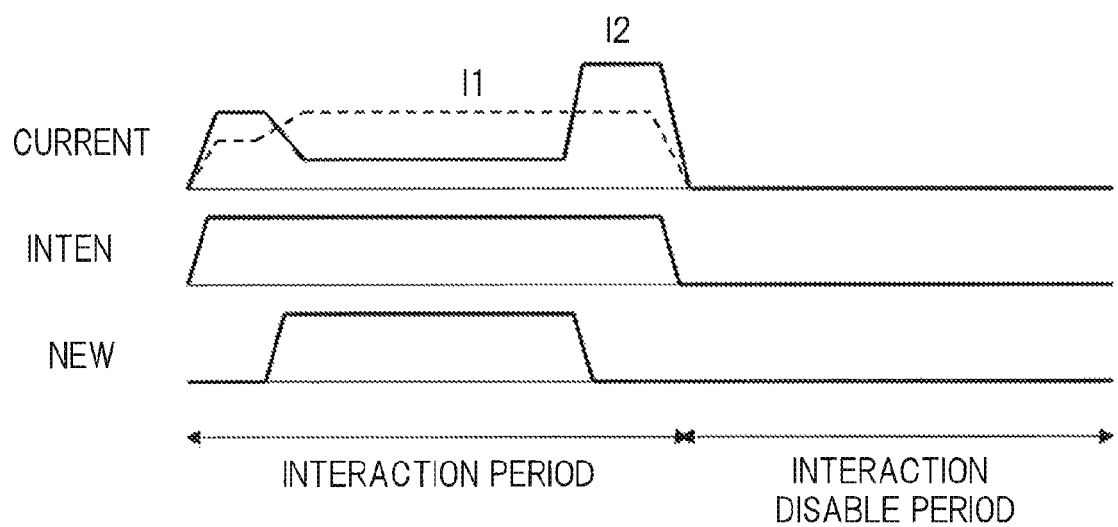
FIG. 11 is a diagram for explaining an example of an operation waveform of the interaction calculation circuit of FIGS. 9 and 10.

10. Circuit Configuration and Circuit Operation of Interaction Calculation Circuit FIGS. 9 to 11 are diagrams for explaining an example of a circuit configuration and a circuit operation of an interaction calculation circuit. That is, the interaction calculation circuit of FIGS. 9 and 10 shows a circuit configuration for achieving a logic circuit of the interaction calculation circuit 340 including the exclusive OR circuit 310, the switching circuit 320 and the majority decision logic circuit 330 in the spin unit 300 shown in FIG. 6 described above. FIG. 9 shows a circuit for adding the current of the majority decision calculation circuit, and FIG. 10 shows a circuit for comparing the added current of FIG. 9. In addition, FIG. 11 shows an operation waveform of the interaction calculation circuit 340 of FIGS. 9 and 10.

FIG. 9 shows a circuit configuration of a part used for adding the currents of the majority decision so as to separate a +1 calculation circuit 510 for adding the currents of spins of +1 (or, 0 or upside) and a −1 calculation circuit 530 for adding the currents of spins of −1 (or, 1 or downside). In FIG. 9, the +1 calculation circuit 510 is shown on an upper side, and the −1 calculation circuit 530 is shown on a lower side.

The +1 calculation circuit 510 is configured of five sets of blocks of parallel connection configured of five NMOS transistors 511, 512, 513, 514 and 515, and a PMOS transistor 521 which connects each block to a power supply potential. The PMOS transistor 521 is gate-controlled by an interaction signal INTEN shown in FIG. 11. In a period when a voltage level of the interaction signal INTEN is high, the PMOS transistor 521 is turned OFF. On the other hand, the PMOS transistor 521 is turned ON in a period when the voltage level is low.

The five sets of blocks are blocks corresponding to an external magnetic field coefficient ISx, interaction coefficients IUx (upside spin), ILx (left-side spin), IRx (right-side spin) and IDx (downside spin), respectively. When attention is focused on the block corresponding to the interaction coefficient IUx, this block is configured of NMOS transistors 511, 512, 513, 514 and 515 which are gate-controlled by NUT, NUB, IU1T, IU1B and IU0, respectively. The NMOS transistors 511, 512, 513, 514 and 515 are turned ON when voltage levels of the corresponding NUT, NUB, IU1T, IU1B and IU0 are high, respectively, and are conversely turned OFF when the voltage levels thereof are low. The NMOS transistors 511 and 513 are connected in series, and the NMOS transistors 512 and 514 are connected in series. The NMOS transistors 511, 513 and the NMOS transistors 512, 514 which are connected in series are connected in parallel.

In this parallel connection, the NMOS transistors 511 and 512 are connected to a common line CT. This common line CT is connected to the power supply potential via the PMOS transistor 521. On the other hand, in the parallel connection, the NMOS transistors 513 and 514 are commonly connected to the NMOS transistor 515. This NMOS transistor 515 is connected to the current comparison line CS1. From this current comparison line CS1, the added current I1 of the +1 calculation circuit 510 is taken out. In this block corresponding to the interaction coefficient IUx, two paths through which the electric current flows are configured.

The same goes for other blocks corresponding to the interaction coefficients ILx, IRx and IDx. The block corresponding to ILx is configured of the NMOS transistors 511, 512, 513, 514 and 515 which are gate-controlled by NLT, NLB, IL1T, IL1B and IL0, respectively. The block corresponding to IRx is configured of the NMOS transistors 511, 512, 513, 514 and 515 which are gate-controlled by NRT, NRB, IR1T, IR1B and IR0, respectively. The block corresponding to IDx is configured of the NMOS transistors 511, 512, 513, 514 and 515 which are gate-controlled by NDT, NDB, ID1T, ID1B and ID0, respectively.

In addition, the block corresponding to the external magnetic field coefficient ISx is configured of the NMOS transistors 511, 512, 513, 514 and 515 which are fixed to be high, are fixed to be high, and are gate-controlled by IS1T, IS1B and IS0, respectively. This external magnetic field coefficient ISx does not take the input from the adjacent spin unit, and therefore, the gates of the NMOS transistors 511 and 512 are fixed to high, and the NMOS transistors 511 and 512 are turned ON.

The −1 calculation circuit 530 is similarly configured of five sets of blocks of parallel connection configured of five NMOS transistors 531, 532, 533, 534 and 535, and a PMOS transistor 541 which connects each block to a power supply potential. In this −1 calculation circuit 530, a current I2 added from the current comparison line CS2 is taken out. However, the −1 calculation circuit 530 is different from the +1 calculation circuit 510 in that, for example, the NMOS transistor 533 which is gate-controlled by IU1T and the NMOS transistor 534 which is gate-controlled by IU1B are switched and connected in the block corresponding to the interaction coefficient IUx. That is, the NMOS transistors 531 and 534 are connected in series, and the NMOS transistors 532 and 533 are connected in series. The same goes for the blocks corresponding to other interaction coefficients ILx, IRx and IDx and corresponding to the external magnetic field coefficient ISx.

The +1 calculation circuit 510 and the −1 calculation circuit 530 which are configured as described above have the following operation. Here, for simplicity, while attention is focused on the block corresponding to the interaction coefficient IUx, an operation part for performing a calculation using data inputted from the NU and the interaction coefficient stored in the IU0 and the IU1 will be explained.

The common line CT and the common line CB to which the respective NMOS transistors are connected are precharged to a high potential before performing the interaction calculation, that is, in a period of time when the voltage level of the interaction signal INTEN shown in FIG. 11 is low. When the interaction signal INTEN becomes high, the calculation of the interaction value is started.

Data inputted from the NU is divided into complementary signals of the NUT and the NUB. That is, the NUT becomes a value of the NU, and the NUB becomes a value obtained by inverting the NU. In addition, the interaction coefficient IU1 also becomes complementary signals IU1T and IU1B. The IU0 indicates which one of 0 and 1 the interaction coefficient is set to be. When the IU0 is 0, no influence of the value of the interaction coefficient occurs, and therefore, the NMOS transistors 515 and 535 into which the IU0 is inputted is turned OFF so as not to flow the electric current, and therefore, this case does not affect the calculation result. When the IU0 is 1, the NMOS transistors 515 and 535 into which the IU0 is inputted are turned ON, and therefore, the current path associated with the NU and the IU1 is turned ON.

When the values of the NU and the IU1 are equal to each other, the electric current flows through a path of the NMOS transistors 511 and 513 connected in series into which the NUT and the IU1T have been inputted or a path of the NMOS transistors 512 and 514 connected in series into which the NUB and the IU1B have been inputted, and therefore, the current I1 taken out from the current comparison line CS1 is added. On the other hand, when the values of the NU and the IU1 are different from each other, the current flows through a path of the NMOS transistors 531 and 534 connected in series into which the NUT and the IU1B have been inputted or a path of the NMOS transistors 532 and 533 connected in series into which the NUB and the IU1T have been inputted, and therefore, the current I2 taken out from the current comparison line CS2 is added.

The same goes for the blocks corresponding to other interaction coefficients ILx, IRx and IDx. The blocks performs the calculation using data inputted from the NL, the NR and the ND and the interaction coefficients stored in the IL0, the IR0 and the ID0, and the IL1, the IR1 and the ID1, respectively.

That is, the current I1 taken out from the current comparison line CS1 is added in the coefficient having the value of the interaction coefficient which is equal to the inputted data, and the electric current I2 taken out from the current comparison line CS2 flows in the coefficient having the value of the interaction coefficient which is different from the inputted data. That is, the current I1 taken out from the current comparison line CS1 is added in the coefficient having the exclusive OR value shown in FIG. 6 of 1, and the electric current I2 taken out from the current comparison line CS2 is added in the coefficient having the value of 0. Therefore, by comparing the current I1 taken out from the current comparison line CS1 and the current I2 taken out from the current comparison line CS2 with each other, the majority decision indicating which one is larger can be calculated.

A circuit for comparing the current I1 taken out from the current comparison line CS1 and the current I2 taken out from the current comparison line CS2 described above is shown in FIG. 10. FIG. 10 shows a circuit configuration of the current comparison circuit for comparing the current I1 and the current I2. The current comparison circuit 550 is configured of combination of current mirror circuits formed of MOS transistors, and is configured of a pair of the current mirror circuit of the current I1 and the current mirror circuit of the current I2. For the current comparison circuit 550, clock synchronization is not required because of an analog operation.

The current mirror circuit of the current I1 is configured of one PMOS transistor 551 and two NMOS transistors 552 and 553 whose gates are connected to each other. The current mirror circuit of the current I2 is similarly configured of one PMOS transistor 556 and two NMOS transistors 557 and 558 whose gates are connected to each other.

In the current mirror circuit of the current I1, a source of the PMOS transistor 551 is connected to the power supply potential VDD, and a drain thereof is connected to a drain of the NMOS transistor 553. A drain of the NMOS transistor 553 is connected to a drain of the PMOS transistor 551, a source thereof is connected to the ground potential, and a gate thereof is connected to a gate of the NMOS transistor 552. A drain of the NMOS transistor 552 is connected to a gate of the same and a gate of the NMOS transistor 553, and a source thereof is connected to the ground potential.

Also in the current mirror circuit of the current I2, a similar connection configuration is adopted. Further, a gate of the PMOS transistor 551 in the current mirror circuit of the current I1 and a gate of the PMOS transistor 556 in the current mirror circuit of the current I2 are connected to each other. In addition, a gate of the PMOS transistor 551 in the current mirror circuit of the current I1 and a drain of the same are connected to each other.

In the current comparison circuit 550 having the connection configuration as described above, the current I1 taken out from the current comparison line CS1 of the +1 calculation circuit 510 is supplied to the drain of the NMOS transistor 552 in the current mirror circuit of the current I1. In addition, the current I2 taken from the current comparison line CS2 of the −1 calculation circuit 530 is supplied to the drain of the NMOS transistor 557 in the current mirror circuit of the current I2. The output NEW of the current comparison circuit 550 is taken from a connection node between the drain of the PMOS transistor 556 and the drain of the NMOS transistor 558 in the current mirror circuit of the current I2.

In the current comparison circuit 550, as for the current I1 supplied to the drain of the NMOS transistor 552 in the current mirror circuit of the current I1, the same current I1 flows also through the drain of the NMOS transistor 553, and besides, the same current I1 flows also through the drain of the PMOS transistor 556. In addition, as for the current I2 supplied to the drain of the NMOS transistor 557 in the current mirror circuit of the current I2, the same current I2 flows also through the drain of the NMOS transistor 558. Then, the current I1 flowing through the drain of the PMOS transistor 556 and the current I2 flowing through the drain of the NMOS transistor 558 are compared with each other. As a result of the comparison, as shown in FIG. 11, 1 is outputted as the value NEW of the next state of the spin if the current I1 is larger, that is, if the number of the coefficients each having 1 as a result of the exclusive OR between the input data and the coefficient is larger, and 0 is outputted as the value NEW of the next state of the spin if the current I2 is larger, that is, if the number of the coefficients each having 0 as a result of the exclusive OR between the input data and the coefficient is larger.

The above-described operation is executed in the period when the voltage level of the interaction signal INTEN is high. In such a period when the interaction signal INTEN is high, the current is always checked, and the output NEW changes. This period is the interaction period. In this interaction period, the coefficients of either +1 (or, 0 or upside) or −1 (or, 1 or downside) which is larger in the number of coefficients can be determined as the next state of the spin. In addition, in the period when the interaction signal INTEN is low, the current is turned OFF (to be 0). This period is the interaction disable period.

As for the circuit for adding the currents of the majority decision logic shown in FIG. 9 and the circuit for comparing the added current shown in FIG. 10, note that their circuit configurations are variously changeable. For example, as a modification example of FIG. 9, the configuration can be made so that the ground potential side of each block is grounded by the NMOS transistor, and the current on the power supply side is added. In the case of this configuration, the circuit configuration of FIG. 10 becomes a circuit configuration formed by replacing the PMOS transistor and the NMOS transistor with each other. That is, in each of the pair of current mirror circuits, two PMOS transistors whose gates are connected to each other are connected to the power supply potential, and the NMOS transistor is connected to the ground potential. This configuration becomes a circuit configuration which is connected from the PMOS transistors of the pair of the current mirror circuits to each current comparison line and which can compare the magnitudes of the currents of the current comparison lines with each other.

11. Interaction Operation of Ising Chip

Figure 12:
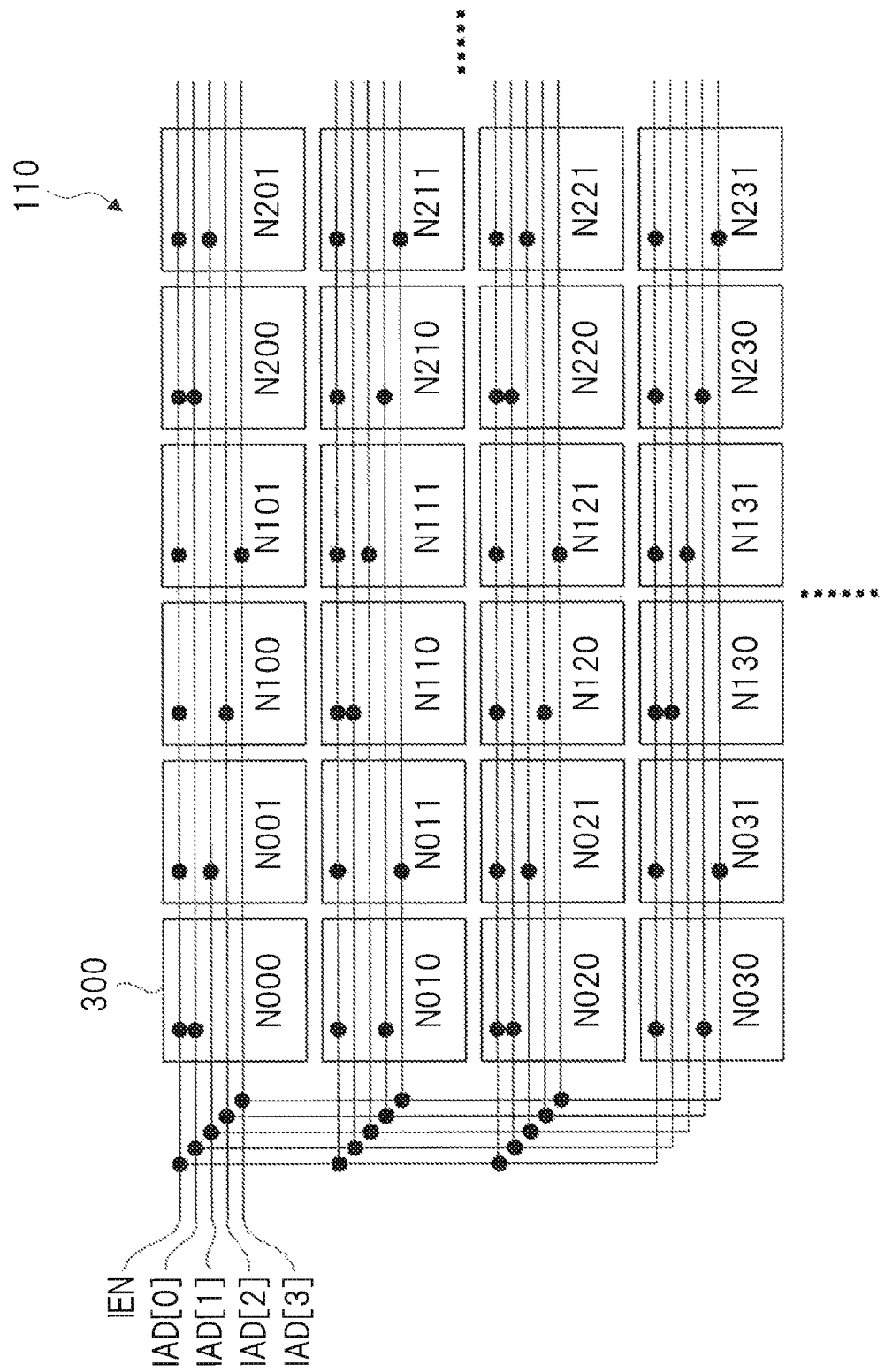
FIG. 12 is a diagram for explaining an example of an interaction (in a case that updating of the value of the spin is partially limited) of the Ising chip of FIG. 1.
Figure 13:
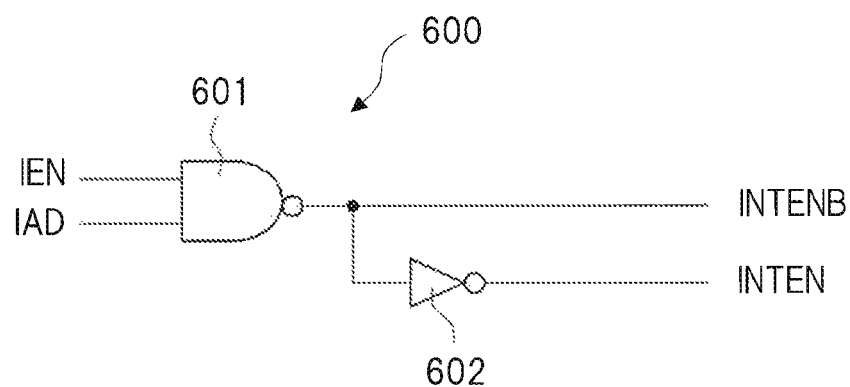
FIG. 13 is a diagram for explaining an example of a circuit for generating an interaction signal in a spin unit by using an enable signal and an address signal in FIG. 12.
Figure 14:
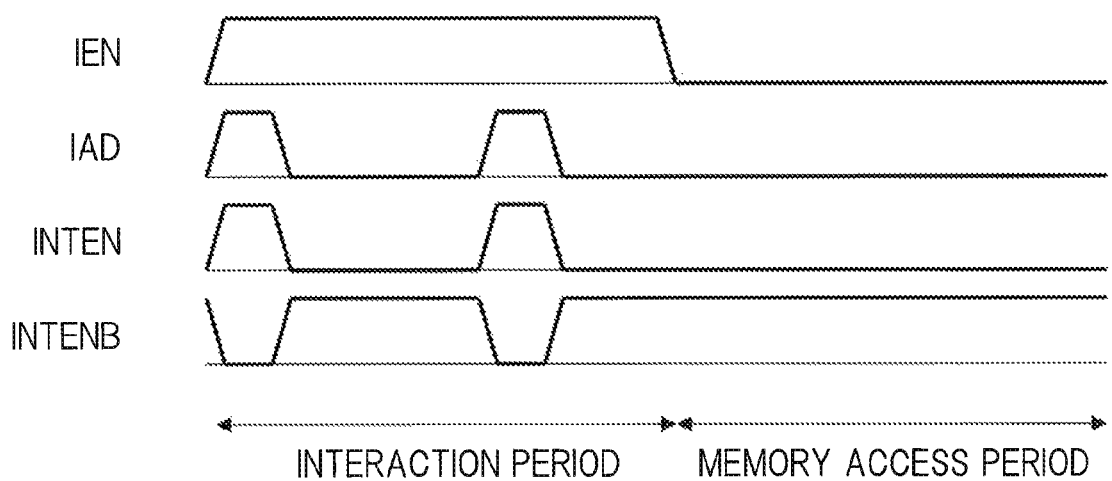
FIG. 14 is a diagram for explaining an example of an operation waveform in the circuit operation of FIG. 13.

FIGS. 12 to 14 are diagrams for explaining an example of the interaction operation of the Ising chip 100. FIG. 12 shows a case that the updating of the value of the spin is partially limited in the arrangement of the spin unit 300. FIG. 13 shows a circuit for generating the complementary interaction signal in the spin unit 300 by using the enable signal and the address signal. FIG. 14 shows the operation waveform of the circuit operation.

As for this interaction operation of the Ising chip 100, in the information processing device 200 embedded with the Ising chip 100, the CPU 210 controls the Ising chip 100 so as to execute the interaction operation in the ground state search.

Prior to the start of the interaction operation, the value of the spin, the interaction coefficient, and the external magnetic field coefficient are inputted to the memory cell in each spin unit 300 of the Ising chip 100 as the initial setting for the Ising model expressing the target problem.

When the interaction operation is started after the completion of the initial setting, the interaction calculation of each spin unit 300 is executed. In this interaction calculation, the address is inputted into the Ising chip 100 via the interaction address line 180, and the interaction signal is generated via the interaction enable line 181, so that the interaction occurs in the Ising chip 100. In addition, a voltage supplied to the spin power supply line 141 is controlled so as to follow a scheduling.

In this case, when it is desired to update all the spins at the same time, if a certain spin is updated, the spin is updated so as to minimize the energy caused with the adjacent spin while checking the adjacent spin. Therefore, when the value of the adjacent spin is updated at the same time with that, the both updating is overlapped with each other, and therefore, the energy cannot be minimized to cause oscillation. Accordingly, in the present embodiment, the spin units 300 in the spin array 110 are grouped so as not to update the adjacent spin at the same time.

FIG. 12 shows an example in which six spin units as the plurality of spin units 300 are arranged in the row direction and four spin units are arranged in the column direction in a second-dimensional lattice shape. In order to distinguish the spin units 300 from each other, coordinates (Nxyz, x=0, 1, and 2, y=0, 1, 2, and 3, and z=0, and 1) are provided for convenience of the explanation. In the plurality of spin units 300 arranged in the second-dimensional lattice shape as described above, the interaction is controlled by the enable signal IEN and the address signals IAD [0], [1], [2] and [3] inputted from the outside.

As shown in FIG. 13, each spin unit 300 includes an interaction signal generation circuit 600 for generating the interaction signals INTEN and INTENB enabling or disabling the execution of the interaction by using the enable signal IEN and the address signal IAD inputted from the outside. This interaction signal generation circuit 600 is configured of a NAND circuit 601 and an inverter 602. The NAND circuit 601 takes the enable signal IEN and the address signal IAD as its input, performs a NOT operation of logical multiplication (AND), and outputs a result of the operation as the interaction signal INTENB. The inverter 602 inverts the output of the NAND circuit 601, and outputs a result of the inversion as the interaction signal INTEN.

The operation waveform of this interaction signal generation circuit 600 is as shown in FIG. 14. A period when the enable signal IEN is high is an interaction period when the interaction occurs. On the other hand, a period when the enable signal IEN is low is a memory access period when the access to the memory cell is executed without the occurrence of the interaction.

In the interaction period, the address signal IAD is inputted in the period when the enable signal IEN is high, the corresponding interaction signal INTEN becomes high. At this time, in the spin unit 300 to which the address signal IAD is inputted, the value of the spin is updated. For example, in the example of the address signal IAD[0] in FIG. 12, the values of the spins are updated in the spin units N000, N200, N110, N020, N220, and N130 to which this address signal IAD [0] is inputted. In this case, when attention is focused on, for example, the spin unit N110, the upside spin unit N100 of this spin unit N110, the left-side spin unit N011 thereof, the right-side spin unit N111 thereof, and the downside spin unit N120 thereof are not updated. As a result, the adjacent spin unit is not updated at the same time.

Also in the examples of other address signals IAD[1] to [3], similarly, the spin units N001, N201, N111, N021, N221, and N131 to which the address signal IAD[1] is inputted are updated at the same time, the spin units N100, N010, N210, N120, N030, and N230 to which the address signal IAD[2] is inputted are updated at the same time, and the spin units N101, N011, N211, N121, N031, and N231 to which the address signal IAD[3] is inputted are updated at the same time. As described above, the updating of the values of the spins is partially limited so that the adjacent spin unit is not updated at the same time.

Then, after the interaction calculation for all the spin units is repeated during predetermined time, the interaction operation ends. As the predetermined times, for example, optical time is set in accordance with the target problem. Note that it is set how many times the enable signal is turned ON/OFF. When this interaction operation ends, a solution for the Ising model expressing the target problem can be obtained by reading the value of the spin which is the result of the interaction calculation from the Ising chip 100.

12. Effect

According to the present embodiment described above, a technique capable of executing the interaction calculation in non-synchronization with the cloak in the Ising chip 100 which obtains the ground state of the Ising model can be provided by embedding an analog circuit in the interaction calculation circuit 340 in the spin unit 300. More details are as follows.

(1) The interaction calculation circuit 340 for determining the next state of the spin by the majority decision logic using the two values in the product of the value of the adjacent spin with the interaction coefficient corresponding to the value and in the external magnetic field coefficient includes the analog circuit. In this manner, the interaction calculation can be executed without the clock synchronization because of the analog operation.

(2) The interaction calculation circuit 340 can be controlled by the interaction signals INTEN and INTENB which enable or disable the execution of the interaction. In this manner, the interaction can be always checked without the clock synchronization in the period when the execution of the interaction is enabled.

(3) The interaction calculation circuit 340 includes: the logic circuit including the +1 calculation circuit 510 and the −1 calculation circuit 530; and the current comparison circuit 550 for comparing the +1 calculation circuit 510 and the −1 calculation circuit 530 in the added current. In this manner, in the configuration formed of the plurality of parallel-connected current paths, the +1 calculation circuit 510 can add the currents of the spins of +1. Further, in the configuration formed of the plurality of parallel-connected current paths, the −1 calculation circuit 530 can add the currents of the spins of −1. And, in the configuration formed of the combination of the current mirror circuits, the current comparison circuit 550 can compare the current of the current comparison line CS1 on which the result of the +1 calculation circuit 510 appears and the current of the current comparison line CS2 on which the result of the −1 calculation circuit 530 appears, and can output the value corresponding to the larger current as the value for determining the next state of the spin.

(4) The interaction calculation circuit 340 can add the currents in the +1 calculation circuit 510 and the −1 calculation circuit 530 in the interaction period when the interaction signal INTEN is high, and can change the value for determining the next state of the spin in the current comparison circuit 550. The interaction signal INTEN can turn the currents in the +1 calculation circuit 510 and the −1 calculation circuit 530 OFF in the interaction disable period when the interaction signal INTEN is low.

(5) The interaction calculation circuit 340 can include the writing circuit 410 writing into the memory cell N, and can control this writing circuit 410 by using the interaction signals INTEN and INTENB. In this manner, the value of the next state determined in the interaction calculation can be written into the memory cell N without the clock synchronization.

(6) The spin unit 300 can include the interaction signal generation circuit 600, and can be controlled based on the interaction signals INTEN and INTENB generated by this interaction signal generation circuit 600. In this manner, the spin unit 300 for updating the value of the spin can be limited.

(7) The spin unit 300 can prohibit the simultaneous updating of the adjacent spin unit 300 based on the interaction signals INTEN and INTENB.

(8) The interaction signal generation circuit 600 includes the logic circuit, so that the interaction signals INTEN and INTENB can be generated by using the address signal IAD.

(9) In the information processing device 200, the control program of the Ising chip 100 writes the value of the spin, the interaction coefficient, and the external magnetic field coefficient into the spin unit 300 in the spin array 110. And, the value of the spin of the spin unit 300 which has reached the ground state is read by repeatedly executing the processing of the ground state search for the spin unit 300 by predetermined times, so that the solution for the target problem can be obtained.

In the foregoing, the invention made by the present inventors has been concretely described based on the embodiments. However, it is needless to say that the present invention is not limited to the foregoing embodiments and various modifications and alterations can be made within the scope of the present invention. Further, the other structure can be added to/eliminated from/replaced with a part of the structure of each embodiment.

For example, the above-described embodiments have been explained for easily understanding the present invention, but are not always limited to the ones including all structures explained above. Further, the other structure can be added to/eliminated from/replaced with a part of the structure of each embodiment.

In addition, in the above-described embodiments, the Ising model which is typical in the field of physics has been exemplified for the explanation. However, the present invention is not limited to this, and is applicable to the whole of the interaction model capable of expressing various physical phenomena and social phenomena.

What is claimed is:

1. A semiconductor device comprising:
a plurality of units each of which includes a first memory cell for storing a value indicating a state of one node of an interaction model, a second memory cell for storing an interaction coefficient indicating an interaction from a node connected to the one node, and an interaction calculation circuit for determining a value indicating a next state of the one node based on a current determined by a value indicating a state of the connected node and the interaction coefficient;
wherein the interaction calculation circuit is controlled by an interaction signal which enables or disables execution of interaction; and
wherein the interaction calculation circuit includes:
a logic circuit which adds currents of a first value and a second value based on the value indicating the state of the connected node and the interaction coefficient; and
a comparison circuit which compares the added currents based on a result of the logic circuit, and outputs the first value or the second value as the value indicating the next state of the one node.

2. The semiconductor device according to claim 1,
wherein the logic circuit includes: a first calculation circuit which adds the current of the first value and which is configured of a plurality of parallel-connected current paths configured of a plurality of MOS transistors each of which is gate-controlled based on the value indicating the state of the connected node and the interaction coefficient; and a second calculation circuit which adds the current of the second value and which is configured of a plurality of parallel-connected current paths configured of a plurality of MOS transistors each of which is gate-controlled based on the value indicating the state of the connected node and the interaction coefficient, the comparison circuit is configured of combination of a current mirror circuit configured of a MOS transistor, which compares a current of a first current comparison line on which a result of the first calculation circuit appears and a current of a second current comparison line on which a result of the second calculation circuit appears, and which outputs the first value or the second value corresponding to a larger current as the value indicating the next state of the one node.

3. The semiconductor device according to claim 2, wherein, in the interaction calculation circuit, the currents in the first calculation circuit and the second calculation circuit are added in a period when the interaction signal enables the execution of the interaction so as to change the value indicating the next state of the one node in the comparison circuit, and currents in the first calculation circuit and the second calculation circuit are turned OFF in a period when the interaction signal disables the execution of the interaction.

4. The semiconductor device according to claim 1, wherein the interaction calculation circuit includes a writing circuit which writes the first value or the second value, which is outputted from the comparison circuit, into the first memory cell, and the writing circuit is controlled by the interaction signal.

5. The semiconductor device according to claim 1, wherein each of the plurality of units includes a generation circuit for generating the interaction signal, and a unit for updating the value indicating the state of the node is limited based on the interaction signal generated in the generation circuit.

6. The semiconductor device according to claim 5, wherein, in each of the plurality of units, simultaneous updating of an adjacent unit is prohibited based on the interaction signal.

7. The semiconductor device according to claim 6, wherein the generation circuit includes a logic circuit which generates the interaction signal by using an address signal.

8. An information processing device to which a semiconductor device capable of operating as a CPU, a RAM, a HDD, and an accelerator is connected via a system bus, wherein the semiconductor device includes:

a plurality of units each of which includes a first memory cell for storing a value indicating a state of one node of an interaction model, a second memory cell for storing an interaction coefficient indicating an interaction from a node connected to the one node, and an interaction calculation circuit for determining a value indicating a next state of the one node based on a current determined by a value indicating a state of the connected node and the interaction coefficient;

an I/O interface which performs reading from/writing to a memory cell of the plurality of units; and an interaction control interface which supplies a signal for enabling interaction to the plurality of units, and, in a control program of the semiconductor device executed on the CPU, the value indicating the state of the node and the interaction coefficient are written into the plurality of units on the semiconductor device to which each node of the interaction model expressing a target problem is assigned, a processing of ground state search for the plurality of units is repeatedly executed during predetermined time, and the value indicating the state of the node of the plurality of units which has reached the ground state is read, so that a solution for the target problem is obtained.

9. The information processing device according to claim 8, wherein the processing of the ground state search for the plurality of units is controlled by an interaction signal which enables or disables execution of interaction.

10. The information processing device according to claim 9, wherein the processing of the ground state search for the plurality of units changes the value indicating the state of the one node by adding the current in the interaction calculation circuit in a period when the interaction signal enables the execution of the interaction, and turns a current in the interaction calculation circuit OFF in a period when the interaction signal disables the execution of the interaction.

11. The information processing device according to claim 10, wherein the processing of the ground state search for the plurality of units writes the value indicating the next state of the node determined in the interaction calculation circuit into the first memory cell based on the interaction signal.

12. The information processing device according to claim 9, wherein the processing of the ground state search for the plurality of units limits a unit for updating the value indicating the state of the node based on the interaction signal.

13. The information processing device according to claim 12, wherein the processing of the ground state search for the plurality of units prohibits simultaneous updating of an adjacent unit based on the interaction signal.

* * * * *